United States Patent [19]
Knuth et al.

[11] Patent Number: 5,804,995
[45] Date of Patent: Sep. 8, 1998

[54] MONITORING CIRCUIT FOR A SUPPLY VOLTAGE

[75] Inventors: Manfred Knuth; Rainer Horstkotte, both of Seligenstadt, Germany

[73] Assignee: Schneider Automation GmbH, Seligenstadt, Germany

[21] Appl. No.: 847,588

[22] Filed: Apr. 24, 1997

[51] Int. Cl.$^6$ .............................. H03K 5/153; H03K 3/02
[52] U.S. Cl. .............................. 327/74; 327/143; 327/198
[58] Field of Search ................................ 327/74, 75, 143, 327/198, 76

[56] References Cited

U.S. PATENT DOCUMENTS

| | | | |
|---|---|---|---|
| 4,317,080 | 2/1982 | Acker | 327/74 |
| 5,367,265 | 11/1994 | Gaudette | 327/74 |
| 5,446,404 | 8/1995 | Badyal et al. | 327/198 |
| 5,514,981 | 5/1996 | Tam et al. | 327/198 |

FOREIGN PATENT DOCUMENTS

| | | | |
|---|---|---|---|
| 0127139 | 12/1984 | European Pat. Off. | G01R 19/165 |
| 3910212 | 4/1994 | Germany | G01R 19/165 |

*Primary Examiner*—Toan Tran
*Attorney, Agent, or Firm*—Dennison, Meserole, Pollack & Scheiner

[57] ABSTRACT

The subject of the invention is a monitoring circuit for at least one supply voltage, having comparators that generate a first report signal if the supply voltage is below a predeterminable threshold value and a second report signal after a fixed warning time elapses. The supply voltage is supplied in a first circuit unit (4) to a first comparator (7). The first comparator is followed by a switch element, with which a capacitor (19), connected parallel to it and chargeable from an operating voltage source, can be short-circuited in order to lower the input voltage of a second comparator (13), disposed in the control unit (4), to below a second reference voltage that defines a limit value for the resetting of the report signal. The noninverting output of the second comparator (13) is followed by the base of an output transistor (14), whose emitter is connected to the negative pole of the operating voltage, the positive pole whereof is connected via a resistor (31) to the collector of the output transistor (14). The first report signal appears at the output transistor (14). The collector of the output transistor (14) is followed via a diode (20) by a capacitor (23), which in a second circuit unit (24) identical to the first circuit unit (4) is connected to the first comparator (7').

8 Claims, 4 Drawing Sheets

5,804,995

MONITORING CIRCUIT FOR A SUPPLY VOLTAGE

SPECIFICATION

The invention relates to a monitoring circuit for at least one supply voltage, having comparators that generate a first report signal if the supply voltage is below a predetermined threshold value and a second report signal after a fixed warning time elapses.

Such monitoring circuit is known (German Patent DE 39 10 212 C2). In this monitoring circuit, the first and second report signals and a signal from a monitoring circuit respond if a predetermined lower threshold of the supply voltage is to direct switch elements into a switching state in which the terminals for the report signals are disconnected from the pole having a high voltage level that furnishes the supply voltage and are applied to the other pole, which furnishes a low supply voltage. This assures that the first and second report signals will have the necessary level for reliable detection even if the supply voltage, for a relatively long period of time, is at a level which while it does have a certain height still does not have a level sufficient to operate a data processing system.

OBJECTS OF THE INVENTION

The object of the invention is to furnish a monitoring circuit for a supply voltage with which the report signal and the warning signal can be generated in bounce-free and zero-voltage-proof fashion at little effort or expense in the event of a malfunction and can be generated in reset fashion when the voltage returns. The term "bounce-free" should be understood to mean that a signal remains at a certain level for a certain minimum length of time. "Zero-voltage-proof" means that the signals remain at a safe level, such as zero volts, regardless of the other levels present in the monitoring circuit, even during undervoltage, for instance.

In accordance with the invention, this object is attained in a monitoring circuit of the type described above in that the supply voltage is delivered in a first circuit unit to a first comparator for comparison with a reference voltage that defines a lower, first limit value for the generation of the first report signal; that in the circuit unit the first comparator is followed by a switch element, with which a capacitor, connected parallel to it and chargeable from an operating voltage source, can be short-circuited in order to lower the input voltage of a second comparator, disposed in the control unit, to below a second reference voltage that defines a limit value for the resetting of the report signal; that the noninverting output of the second comparator is followed by the base of a bipolar output transistor, whose emitter is connected to the negative pole of the voltage source that supplies operating voltage to the control unit, the positive pole of this source being connected via a resistor to the collector of the output transistor, at which, or at least at an amplifier following the output transistor, the first report signal appears; that the collector of the output transistor is followed via a diode by a capacitor that can be charged by a resistor and discharged by a resistor and that is connected in a second circuit unit, identical to the first circuit unit, to the first comparator; and that the second report signal is generated at the collector of the output transistor of the second circuit unit or at least at an amplifier following this output transistor. To generate the two report signals, two identical circuit units are used in this arrangement, which makes for an especially economical construction. The capacitors placed parallel to the switch elements are charged by the operating voltage source, and by their capacitances they determine the times that elapse, after the operating voltage is turned back on or reappears, until the report signals are reset. The capacitance of the capacitor connected to the second control unit determines the time lag between the first and second report signals.

Preferably, the supply voltage is the same voltage as the operating voltage of the control units. In this embodiment, one voltage source can be dispensed with.

In particular, the switch elements in the control units are thyristors that can be turned on and off, which withstand the currents of the capacitors upon short-circuiting.

In an expedient embodiment, the collector of the output transistor of the first circuit unit is connected to a resistor, which is connected to the base of a bipolar transistor, whose base is connected via a further resistor to the positive pole of the operating voltage source and whose collector supplies the base of a transistor that forms one output of the monitoring circuit and whose emitter is connected via a resistor to the positive pole of the operating voltage source and at whose collector the report signal appears.

It is also favorable if the collector of the output transistor of the second circuit unit is connected to a gate circuit, of which a further input is applied via a resistor that can be short-circuited by a bridge; the gate circuit is connected on the output side via a resistor to the base of a bipolar transistor, whose base is supplied via a further resistor from the positive pole of the operating voltage source and whose collector supplies the base of a further bipolar transistor, forming one output of the monitoring circuit, whose emitter is connected to the positive pole of the operating voltage source via a resistor and at whose collector the report signal appears. Except for the gate circuit and the short-circuitable resistor, this arrangement corresponds with that for generating the first report signal. In the case of the short-circuited resistor, the same time lags occur in the first and second report signals after the return of voltage.

In another expedient embodiment, the bases of the transistors that form the outputs of the monitoring circuit are each connected via a respective resistor to the positive pole of the operating voltage source and via a further respective resistor to the cathode of a Zener diode, which is disposed in series with a resistor between the poles of the operating voltage source. In this arrangement, the transistor remains at a non-conducting state during the output of report signals that correspond to the potential of the negative pole of the operating voltage even if the operating voltage drops below a low threshold and remains there for a more or less long time. This assures the zero-voltage-proof aspect.

Preferably, the emitters of the transistors forming the outputs of the monitoring circuit are each connected to a respective current limiting circuit, which is connected via diodes to the base of the transistor that precedes the respective transistor at the output of the monitoring circuit. By means of the current limiting circuit it is possible in a simple way to connect the collectors of the transistors of the monitoring circuit outputs of a plurality of monitoring circuits to one another in a hardwired-or fashion. Such a provision is appropriate for instance if a plurality of power supply units are required for one circuit and each unit is equipped with its own monitoring circuit. The current limiting circuits prevent impermissibly high output currents in the power supply units not affected by undervoltages.

An embodiment in which the inverting outputs of the second comparators of the circuit units are each followed by bipolar transistors, whose emitters are applied to the positive pole of the operating voltage, and whose collectors are each connected via a respective resistor to the base of a transistor whose collector-to-emitter path is disposed parallel to the collector resistor of the transistor disposed at the output of the monitoring circuit, is advantageous.

With this arrangement, the outputs of further monitoring circuits, which are in a wired-or connection on the output side, are pulled to the negative level of the operating voltage.

DETAILED DESCRIPTION OF THE INVENTION

Figure 1:
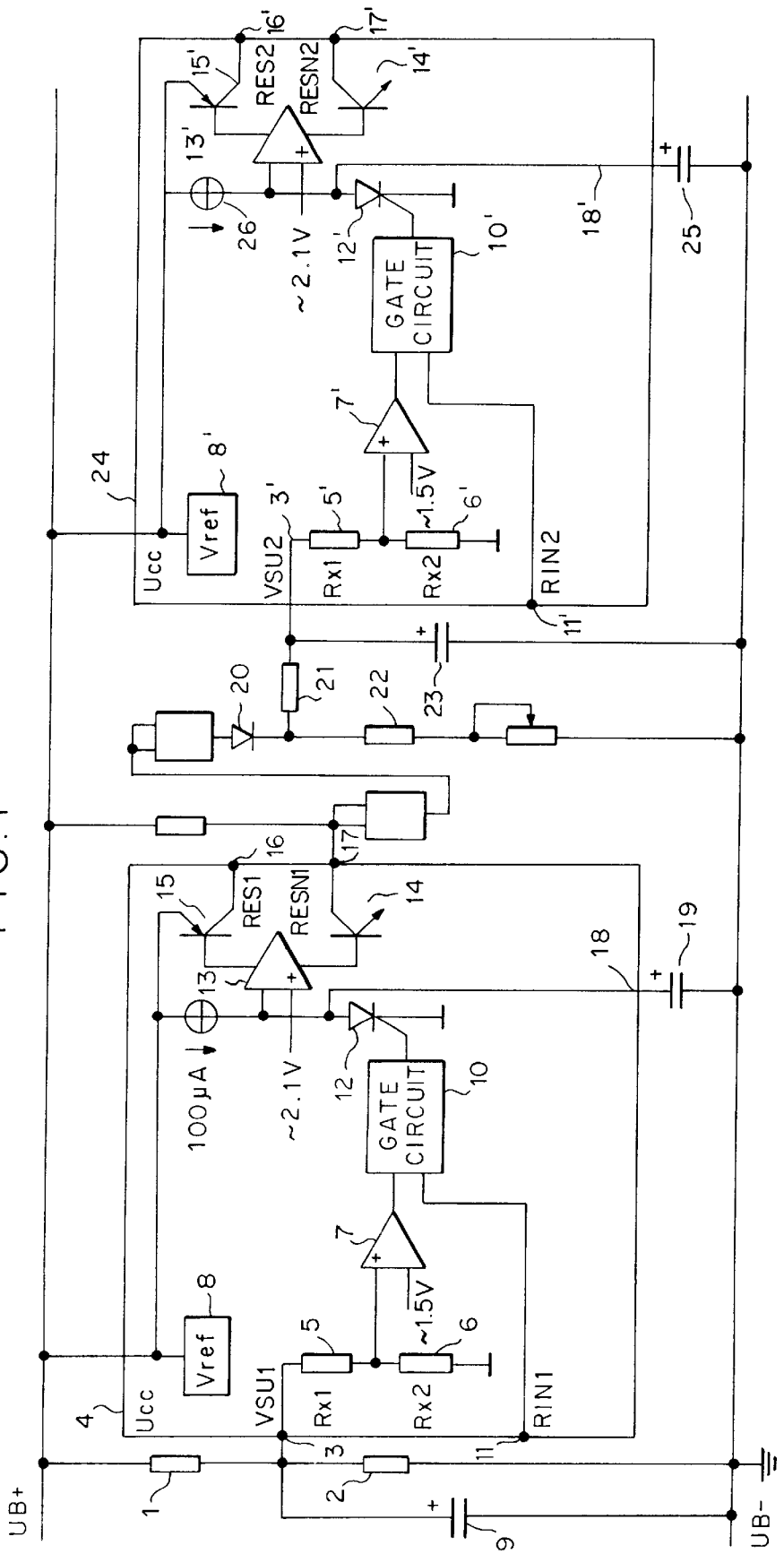
FIG. 1 shows a basic circuit diagram of a circuit for monitoring supply voltages.

FIG. 1 describes an exemplary embodiment of the invention.

The monitoring circuit for a supply voltage that has two poles UB+ and UB−, of which UB− is applied to ground, includes a voltage divider comprising two resistors 1, 2, which is connected between poles UB+ and UB− and whose pickup is connected to the input 3 of a circuit unit 4. The input 3 is connected to a voltage divider comprising two resistors 5, 6, which is likewise connected to the negative pole. The pickup of the voltage divider of the resistors 5, 6 is applied to the noninverting input of a first comparator 7, whose inverting input is acted upon by a first reference voltage, which is generated by a reference voltage source 8 disposed in the control unit 4 and supplied by the supply voltage. The first reference voltage, with the division ratios of the two voltage dividers disposed upstream of the comparator 7, determines the lower limit value of the supply voltage at which the comparator 7 responds, or in other words changes its output signal.

Connected parallel to the resistor 2 is a capacitor 9, which short-circuits interference pulses between the input 3 and the pole UB−. The comparator 7 is followed by a gate circuit 10, whose second input is applied to an input 11 of the control unit. On the output side, the gate circuit 10 is connected to a switch element, which is a thyristor 12 that can be turned on and off and whose cathode is applied to the negative pole UB− and whose anode is connected to the inverting pole of a second comparator 13. The noninverting input of the comparator 13 is also connected to a current source 26, which continues to be connected to the positive pole UB+. The noninverting input of the comparator 13 is acted upon by a second reference voltage, which is generated by the reference voltage source 8 and is higher than the first reference voltage. The second reference voltage determines the limit of the supply voltage at which the second comparator 13 changes its output signal from one level to another.

The noninverting output of the comparator 13 is followed by the base of a bipolar transistor 14, which is applied by its emitter to the negative pole UB−. The transistor 14 is the output transistor of the control unit 4, in which a further bipolar transistor 15 is applied by its base to the inverting output of the comparator 13. The collector of the transistor 15 is connected to one output 16 of the control unit 4. The emitter of the transistor 15 is connected to the positive pole UB+ of the operating voltage. The collector of the transistor 14 is connected to one output 17 of the control unit. A further output 18 of the control unit 4 is connected to the anode of the thyristor 12. One electrode of an external capacitor 19 is connected to the output 18, and the other electrode of this capacitor is connected to the negative pole UB−.

The collector of the transistor 14, or the output 17, is applied via a resistor 31 to the positive pole UB+. The output 17 is also connected, via amplifier or signal former circuits not shown in detail but connected in series, to the anode of a diode 20, whose cathode is connected to a resistor 21 and a resistor 22. The resistor 22 is connected to the negative pole UB−, for instance via a potentiometer or a trimmer. The resistor 21 is followed by one electrode of a capacitor 23, whose other electrode is applied to the negative pole UB−. The resistor 21 and the capacitor 23 are applied to one input 3' of a control unit 24, which has the same construction as the control unit 4. The circuit elements in control unit 24 which are identical to those in control unit 4 and also perform the same functions are therefore identified by the same reference numerals as in FIG. 1, to which a prime is added. It is therefore unnecessary to describe the circuitry of the control unit 21 in further detail here.

Connected to the output 18' of the control unit 24 is one electrode of an external capacitor 25, whose other electrode is applied to the negative pole UB−. The bipolar transistor 14' is an output transistor of the control unit 24. A first report signal and a second report signal are available at the respective outputs 16 and 16', at certain supply voltages. If the supply voltage drops below a critical limit, which as described above can be defined by voltage divider ratios and the first reference voltage, the comparator 7 responds. The limit depends on the operating conditions of the consumers connected to the supply voltage; these are preferably programmable controllers or microcomputers. The limit value is selected such that if that voltage dips to a certain magnitude, which does not yet interfere with the mode of operation of the consumers, but is reported by the first report signal to the respective processor, which can thereupon execute routines for backing up data.

via the gate circuit 10, the comparator 7 causes the firing of the thyristor 12, which short-circuits the capacitor 19. As a result, the voltage at the noninverting input of the comparator 13 is dropped below the reference voltage, and this causes the comparator 13 to respond, which thereupon makes the transistor 14 conducting. The diode 20 is thus polarized in the depletion direction, and as a result the capacitor 23 discharges via the resistors 21, 22. Once the discharging has progressed far enough that the voltage at the input 3' corresponds to the lower limit value of the supply voltage, the comparator 7' changes its output signal. The time constant of the RC circuit in which the capacitor 23 is located is adapted to the demands of the data-processing consumers. The limit value must not be attained until after a time lag, whose duration is adapted to the cycles required for saving the data by means of suitable processor operations. Within this period of time, however, the supply voltage must still have an adequate level for the operation of the data processing system.

The response of the comparator 7', causes firing of the thyristor 12', as a result of which the capacitor 25 is short-circuited. This causes the comparator 13' to change its output signals, and as a result the transistor 14' is made conducting; that is, the second report signal is available, with the potential of the negative pole UB−, at the output 17'. The output 17' may be connected to a collector resistor, not shown, for the transistor 14'. When voltage returns, there is first a very brief state in which an undefined mode of operation of the control units 4 and 24 prevails. Since the first reference voltage is a relatively low voltage, such as 1.5 V, it is available relatively quickly when the voltage rises, so that the comparator 7 responds, causing the first report signal to be generated as described above. The second report signal is also present at the output 16', so that the data processing system is informed that the voltage is too low for proper operation.

Figure 2:
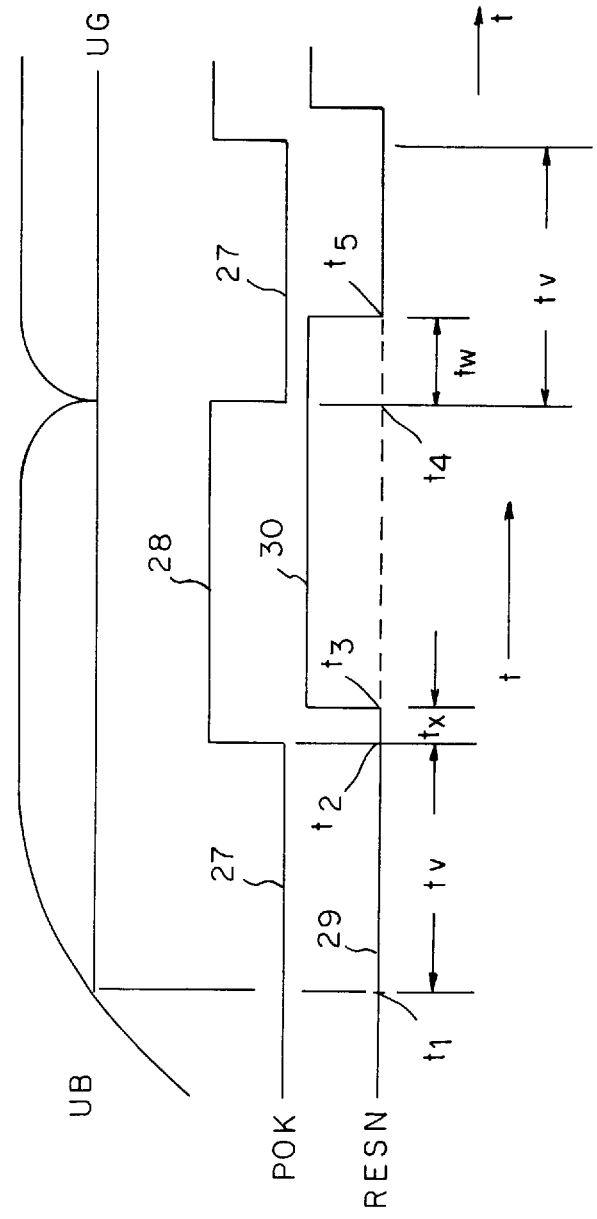
FIG. 2 is a timing diagram of signals in the arrangement of FIG. 1.

FIG. 2 shows the course of the supply voltage UB in the ordinate direction as a function of the time t in the abscissa direction. If the supply voltage at time $t_1$ has dropped below the lower limit value $U_U$, the output signal of the comparator 7 changes, putting the thyristor 12 in the nonconducting state. The current source 16 charges the capacitor 19. By time $t_2$, the charging of the capacitor 19 has reached the second reference voltage value. At this time, the supply voltage UB has reached its rated value. At time $t_2$, the comparator 7 changes its output signals, causing the transistor 14 to become nonconducting. At time $t_2$, the signal POK at the output 16 changes from a value 27 that is approximately equivalent to the potential of the negative pole of the supply voltage and to which the binary value "L" is for instance assigned, to a value 28 that corresponds to the positive potential of the supply voltage. From time $t_2$ on, the capacitor 23 is charged, so that after a short time the comparator 7' changes its output signal, causing the thyristor 12' to be nonconducting and causing the capacitor 25 to be charged from the current source 26'. The capacitor 25 has a lower capacitance than the capacitor 19, so that after a short time, for instance at time $t_3$, the charge voltage reaches and exceeds the second reference voltage of for instance 2 V, at a supply voltage of 5 V. While before time $t_3$, the second report signal RESN, as the second report signal, has a low value 29, such as an "L" value, corresponding to the potential of the negative pole of the supply voltage and corresponding to the second report signal, the signal at the output 16' changes over at time $t_3$ to a high value 30 or H value; resulting in a time lag of duration $t_x$ relative to the time $t_2$.

In FIG. 2, at time $t_4$, a return of the supply voltage UB to the value $U_G$ is shown. At time $t_4$, the first report signal is therefore generated, in the manner already described above, by means of the return of the signal POK to the value 27. At time $t_5$, that is, at a time that is later by the length of the time lag $t_w$, the second report signal is also generated, as described above, by means of a lower level of the signal PWR.

Figure 3:
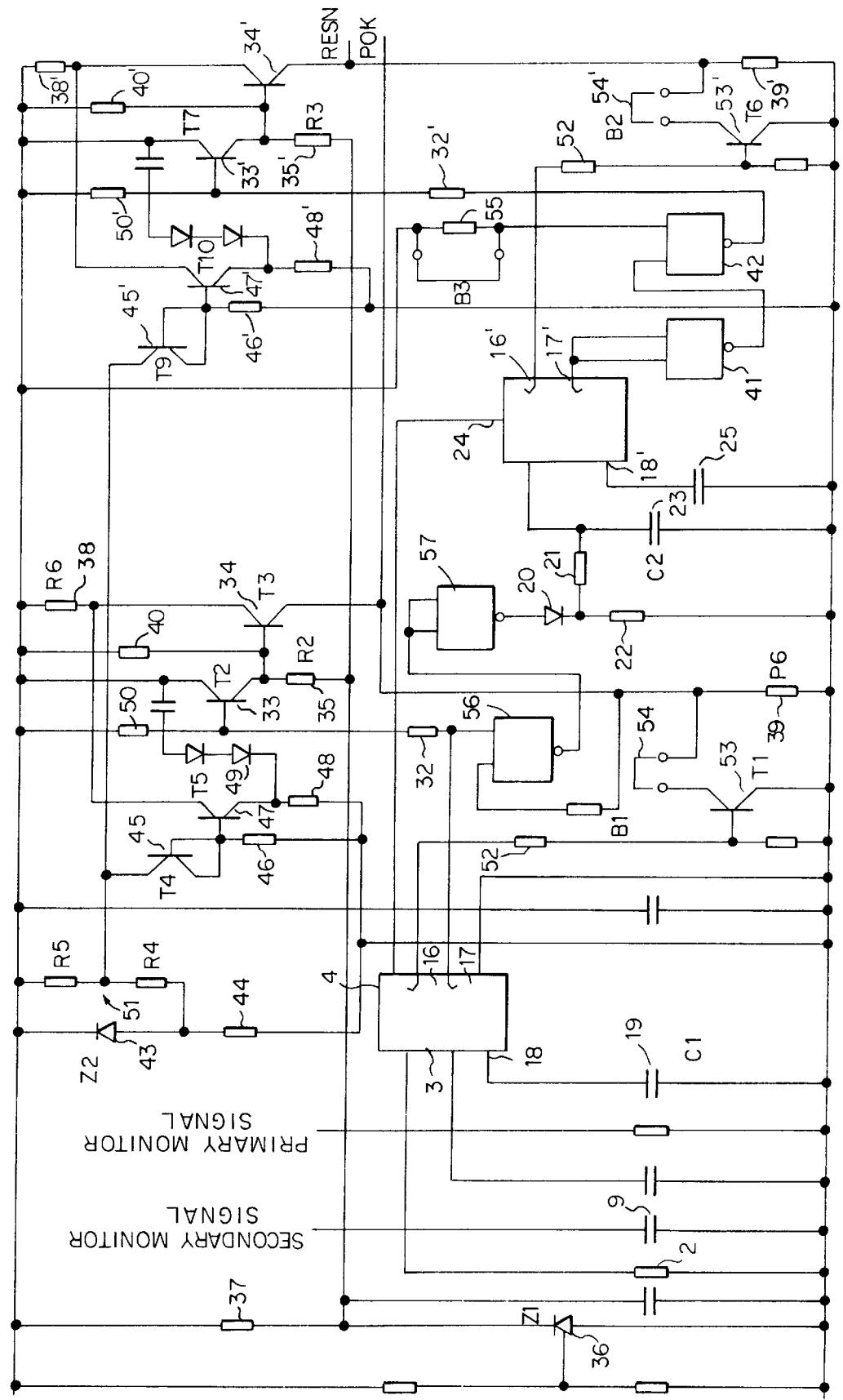
FIG. 3 shows a circuit diagram of a further arrangement for monitoring supply voltages.

FIG. 3 shows a circuit for monitoring a supply voltage UB of 5 V, which contains the two circuit units 4, 24, the diode 20, the resistors 21, 22, and the capacitors 19, 23 and 25. A direct supply voltage to be monitored is applied to the input 3 of the control unit 4. The input 3, as in FIG. 1, is connected to the resistor 2 and the capacitor 9.

The output 17 of the circuit unit 4 is connected via a resistor 32 to the base of a transistor 33, on the one hand, and via two amplifiers or pulse former circuits 56, 57 to the diode 20 on the other. The emitter of the bipolar transistor 33 is acted upon by the voltage UB. The collector of the transistor 33 is connected to the base of a further bipolar transistor 34 and to a collector resistor 35, which is also connected to the cathode of a Zener diode 36 that is disposed in series with a resistor 37 between the poles of the operating voltage. The Zener diode 36 may be embodied as a programmable reference voltage source.

The transistor 34 has a resistor 38 in the emitter circuit and a resistor 39 in the collector circuit and is connected in series with these resistors between the poles of the operating voltage source. A resistor 40 is disposed between the base of the transistor 34 and the positive pole of the operating voltage source. The first report signal appears at the collector of the transistor 34 if the voltage present at the input 3 of the circuit unit 4 is below the limit value $U_G$.

Connected in series to the output side of the output 17' of the control unit 24 are an amplifier or pulse former stages 41 and a gate circuit 42. Connected to the output of the gate circuit 42 is a circuit arrangement whose layout is equivalent to the circuit arrangement connected to the resistor 32. Circuit elements that match one another are therefore identified by the same reference numerals plus a prime. At the collector of a transistor 34, the second report signal RESN appears, if there is critical undervoltage of the supply voltage.

A second Zener diode 43 is connected in series with a resistor 42 between the poles of the operating voltage source. Applied parallel to the Zener diode 43 is a voltage divider 51, whose pickup is connected to the emitters of a bipolar transistor 45 and of a transistor 45'. The bases and collectors of the transistors 45, 45' are connected to a respective resistor 46, 46' and to the base of a further bipolar transistor 47, 47'. The emitters of the transistors 47, 47' are each connected to the emitters of the respective transistors 34, 34'.

The collectors of the transistors 47, 47' are each connected via a respective resistor 48, 48' to the negative pole of the operating voltage source. The collectors of the transistors 47 and 47' are each also connected via at least one diode 49, 49' to the bases of the respective transistors 33, 33'. The bases of each of the transistors are connected via a respective resistor 50, 50' to the positive pole of the operating voltage source. The transistors 45, 47; 45', 47' and the resistors 46, 38; 38', 46', together with the output of the voltage divider 51, form current limiting circuits for the transistors 34, 34'.

A primary supply voltage is applied to the input 11 of the circuit unit 4 and is likewise monitored in the sense that its absence, via the gate circuit 10, makes the thyristor 12 conducting. The outputs 16, 16' of the circuit units 4, 24 are each connected via a respective resistor 52, 52' to the base of a transistor 53, 53'. The emitter-to-collectors paths of the transistors 53, 53' are each connected parallel to the resistors 39, 39' via removable bridges 54, 54'.

If a plurality of power supply units are connected in parallel in order to increase the output currents, the bridges 54, 54' are plugged in. The bridges 54, 54' are not plugged in if power supply units cooperate to increase the availability. The transistors 34, 34' can cooperate at their collectors with corresponding transistors of other monitoring circuits in a wired-or linkage. If the collector potentials of the transistors 34 or 34' are pulled by other monitoring circuits to low potential, then the currents flowing via the transistors 34, 34' are limited to harmless values.

In the parallel circuit for increasing the current of power supply units, the npn transistors 53, 53' pull the signals of the other units to low potential. In the parallel circuit for increasing availability, these transistors are disconnected, since in a redundant mode of operation the signals can be allowed to assume a low level only if all the power supply units are defective.

The second input of the gate circuit 42 is applied to the positive pole of the operating voltage via a short-circuitable resistor 55. The resistor is short-circuited when the time lag between the two report signals after voltage returns is to be eliminated.

Figure 4:
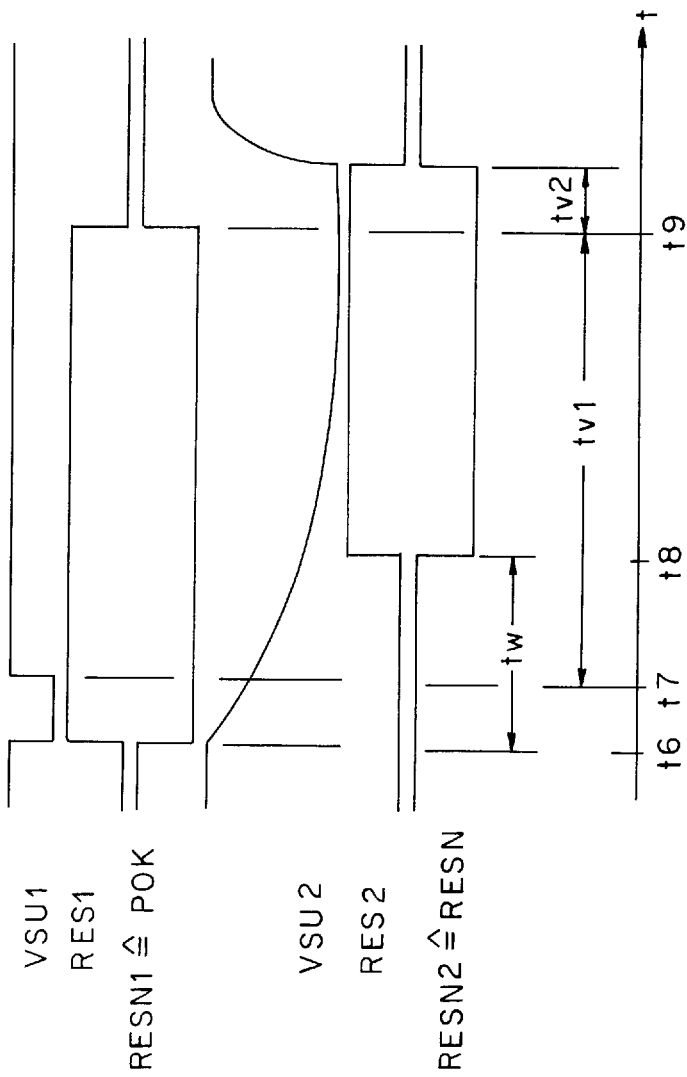
FIG. 4 is a timing diagram of signals in the arrangement of FIG. 3.

FIG. 4 in a timing diagram shows the signal VSU1 at the input 3, which drops below the critical limit voltage at time $t_6$ and rises to the rated voltage again at time $t_7$. A time $t_8$, the signal POK at the collector of the transistor 34 changes to a low level and stays at this level even after time $t_7$, for a period of time $t_{v1}$, as a result of which a de-bounce time is achieved.

The signal VSU2 at the input 3', after the signal POK returns to the low level, changes to the low level in accordance with an exponential function, as a result of which at time $t_8$, that is, after a time lag tw following time $t_6$, the signal RESN at the collector of the transistor 34' changes to a lower level, which rises again to the high level, delayed by the length of time $t_{v2}$ compared with the signal POK, after time $t_9$, at which the de-bounce time $t_{v1}$ has elapsed.

We claim:

1. A monitoring circuit for at least one supply voltage, having comparators that generate a first report signal if the supply voltage is below a predeterminable threshold value and a second report signal after a fixed warning time elapses, wherein the supply voltage is delivered in a first circuit unit (4) to a first comparator (7) for comparison with a reference voltage that defines a lower, first limit value; that in the first circuit unit (4) the first comparator (7) is followed by a switch element, with which a capacitor (19), connected parallel to the switch element and connected to an input of a second comparator (13) and chargeable from an operating voltage source, can be short-circuited by the switch element in order to lower the input voltage of the second comparator (13), disposed in the first circuit unit (4), to below a second reference voltage that defines a limit value for resetting the first report signal; that the noninverting output of the second comparator (13) is followed by the base of a bipolar output transistor (14), whose emitter is connected to the negative pole of the voltage source that supplies operating voltage to the control unit (4), the positive pole of the voltage source being connected via a resistor (31) to the collector of the output transistor (14), at which, or at least at an amplifier following the output transistor (14), the first report signal appears; that the collector of the output transistor (14) is followed via a diode (20) by a second capacitor (23) that can be charged by a second resistor (21) and discharged by a third resistor (22) and that is connected in a second circuit unit (24), identical to the first circuit unit (4), to the first comparator (7') of the second circuit unit; and that the second report signal is generated at the collector of the output transistor (14') of the second circuit unit (24) or at least at an amplifier following this output transistor.

2. The monitoring circuit of claim 1,
wherein
the supply voltage is the same voltage as the operating voltage of the first and second circuit units (4, 24).

3. The monitoring circuit of claim 1,
wherein
the switch elements in the first and second circuit units (4, 24) are thyristors (10, 10') that can be turned on and off.

4. The monitoring circuit claim 1, wherein
the collector of the output transistor (14) of the first circuit unit (4) is connected to a resistor (32), which is connected to the base of a bipolar transistor (33) and whose collector supplies the base of a further transistor (34) that forms one output of the monitoring circuit for the first report signal and whose emitter is connected via a resistor (38) to the positive pole of the operating voltage source and whose collector is connected via a resistor (30) to the negative pole of the operating voltage source.

5. The monitoring circuit of claim 4, wherein
the collector of the output transistor (14') of the second circuit unit (24) is connected to a gate circuit (42), of which a further input is applied via a short-circuitable resistor (55) to the positive pole of the operating voltage; that the gate circuit (42) is connected on its output side via a resistor (32) to the base of a transistor (33'), whose base is supplied via a further resistor (50') by the positive pole of the operating voltage source and whose collector supplies the base of a further transistor (34), which forms one output of the monitoring circuit at its collector for the second report signal; and that the collector and the emitter of the further transistor (34) are connected each via a respective resistor (38', 39') to the positive and negative poles, respectively, of the operating voltage.

6. The monitoring circuit claim 5, wherein
the bases of the further transistors (34, 34') that supply the outputs of the monitoring circuit are each connected via a respective resistor (40, 40') to the positive pole of the operating voltage source and via a further respective resistor (35, 35') to the cathode of a Zener diode (36), which is disposed in series with a resistor (37) between the poles of the operating voltage source.

7. The monitoring circuit claim 5, wherein
the emitters of the further transistors forming the outputs of the monitoring circuit are each connected to a respective current limiting circuit.

8. The monitoring circuit claim 6, wherein
the inverting outputs of the second comparators (13, 13') of the circuit units (4, 24') are each followed by transistors, whose emitters are applied to the positive pole of the operating voltage and whose collectors, each via a respective resistor (52, 52'), are connected to the base of a transistor (53, 53'), whose collector-to-emitter path can be connected parallel to the resistor (39, 39') connected to the emitter of the further transistor (34, 34') that supplies the output of the monitoring circuit.

* * * * *